(12) United States Patent
Guttman et al.

(10) Patent No.: US 7,366,382 B2
(45) Date of Patent: Apr. 29, 2008

(54) OPTICAL BEAM DIAGNOSTIC DEVICE AND METHOD

(75) Inventors: Jeffrey L. Guttman, Los Gatos, CA (US); John M. Fleischer, San Jose, CA (US)

(73) Assignee: Photon, Inc., San Jose, CA (US)

(*) Notice: Subject to any disclaimer, the term of this patent is extended or adjusted under 35 U.S.C. 154(b) by 96 days.

(21) Appl. No.: 10/950,164

(22) Filed: Sep. 24, 2004

(65) Prior Publication Data

US 2005/0123303 A1    Jun. 9, 2005

Related U.S. Application Data

(60) Provisional application No. 60/508,178, filed on Oct. 1, 2003.

(51) Int. Cl.
   *G02B 6/06* (2006.01)
   *H04B 10/12* (2006.01)

(52) U.S. Cl. .................. 385/116; 398/142; 385/115

(58) Field of Classification Search .............. 347/224, 347/238, 241, 256; 385/115, 116; 398/142
   See application file for complete search history.

(56) References Cited

U.S. PATENT DOCUMENTS

| | | | | |
|---|---|---|---|---|
| 4,820,013 A | * | 4/1989 | Fuse | ................ 385/120 |
| 4,880,305 A | | 11/1989 | Salt | ................ 356/141.3 |
| 5,109,153 A | * | 4/1992 | Johnsen et al. | ............ 235/468 |
| 5,882,533 A | * | 3/1999 | Ozawa et al. | ................ 216/11 |
| 6,407,767 B1 | * | 6/2002 | Klees et al. | ................ 347/241 |
| 2005/0094921 A1 | * | 5/2005 | DiFoggio et al. | ............ 385/12 |

FOREIGN PATENT DOCUMENTS

| | | | |
|---|---|---|---|
| JP | 63173670 A | * | 7/1988 |
| JP | 63-263438 | | 10/1988 |
| JP | 7-239220 | | 9/1995 |
| JP | 9-61666 | | 3/1997 |
| JP | 10-26716 | | 1/1998 |
| JP | 200075168 | | 3/2000 |

OTHER PUBLICATIONS

Green, Lawrence; "Monitoring Laser Beam Performance:" TheFabricator.com; Sep. 17, 2001; pp. 1-3.

* cited by examiner

*Primary Examiner*—Tina M Wong
(74) *Attorney, Agent, or Firm*—Finnegan, Henderson, Farabow, Garrett & Dunner, L.L.P.

(57) ABSTRACT

An optical beam diagnostic device includes one or more sets of coherent optical fiber bundles, wherein one end of the coherent optical fiber bundles is arranged to receive optical information from a dynamic moving or static optical beam or beams, and the other end of the coherent optical fiber bundles is arranged to transmit the optical information to a sensor array. Data from the sensor array can then be simultaneously acquired by an analysis system and analyzed to determine one or more characteristics of the optical beam.

13 Claims, 6 Drawing Sheets

OPTICAL BEAM DIAGNOSTIC DEVICE AND METHOD

RELATED APPLICATION

The present application claims priority to U.S. Provisional Application No. 60/508,178, filed on Oct. 1, 2003, which is herein incorporated by reference in its entirety.

BACKGROUND

1. Purpose of the Invention

The present invention is related to optical beam diagnostics and, in particular, to an optical beam diagnostics device and method utilizing coherent optical fiber bundles to characterize dynamic moving or stationary optical beams.

2. Discussion of Related Art

Beam profilers or beam diagnostic instruments are utilized, for example, to characterize the spatial, temporal, focus, and power characteristics of optical beams incident on a print plane in a laser or LED printer. Further, beam profilers can also be utilized to characterize the optical beams of laser scanners for defect scanning, bar code scanning, or other physical measurements. There are commercially available beam diagnostic instruments, such as the BeamPro or the Dynamic BeamProfiler, both produced by Photon, Inc., for dynamic or moving optical beams, such as those in laser printers, for example. In these instruments, the optical beams of the laser head in a laser printer are measured directly with the CCD or area sensor positioned at the focal plane of an optical system.

An examplary conventional beam profile head 64 that can be utilized in a beam profiler system is illustrated in FIG. 7, which shows two views of beam profile head 64. As shown in FIG. 7, beam profiler head 64 includes a plurality of individual charge coupled devices (CCDs) or other area array sensors 60 positioned along a line. Each of the individual sensors 60 are mounted on a mount 62 that can, for example, be positioned to receive light from a scan line of a print head.

FIG. 8 illustrates a raster scan of a beam 30 along a scan line 21 in an image plane 20. Such a raster scan can, for example, represent the optical output of a laser print head. Typically, the beam is modulated resulting in individual pulses 80 along an actual beam path 82 as beam 30 is raster-scanned along scan line 21. As is illustrated, two problems can be immediately discerned: bow and linearity. The bow of beam 30 describes the divergence of beam path 82 from scan line 21. The linearity refers to the variation in the spacing of individual pulses 80 along scan line 21.

As shown in FIG. 7, current beam profile heads can be problematic. For example, beam profile head 64 includes multiple area arrays 60, each of which requires individual readout and analysis circuitry for each array. Further, it is difficult to acquire the data in all area arrays 60 in one frame.

Additionally, each area array 60 is mounted in a holder that limits how close each array 60 can be to a neighboring array 60. As a result, there are limitations on which sections of a scan line 21 can be monitored by profile head 64. Further, each individual array 60 is mounted on substrate 62. Normal tolerances for such mounting results in a variation in the height of each array 60 with respect to substrate 62. This results in the fact that not all of individual arrays 60 will lie in image plane 20, resulting in variations in measuring beam 30 in beam path 82.

In addition to dynamic beams, there are other scanning slit systems for measuring static beams, such as in an LED printhead, or for characterizing beams in dynamic scanning systems such as defect scanners by static positioning of the beam. Profiles are measured directly with the scanning slit positioned at the focal plane of an optical system. A scanning-slit profiling method to characterize LED print heads is discussed in C. K. Kamimura and Y. Aiko in "High Resolution LED Print Head", OKI Technical Review, Vol. 64, pp. 61-64, August 1998. U.S. Pat. No. 5,155,790, entitled "Electronic Scanner or Printer with Ordered Fiber Optic Array" discloses an electronic scanner or printer that employs a plurality of light conduits. Additionally, examples of applications of optical fibers or optical fiber bundles may be found, for example, in U.S. Pat. No. 4,323,925, entitled "METHOD AND APPARATUS FOR ARRAYING IMAGE SENSOR MODULES," U.S. Pat. No. 4,441,817, entitled "ELECTRO-OPTICAL SENSORS WITH FIBER OPTIC BUNDLES," U.S. Pat. No. 4,650,280, entitled "FIBER OPTIC LIGHT TRANSFER DEVICE, MODULAR ASSEMBLY, AND METHOD OF MAKING," and U.S. Pat. No. 5,550,380, entitled "RADIATION IMAGE DETECTING APPARATUS INCLUDING BUNDLED OPTICAL FIBERS."

However, it is desirable to provide a beam diagnostic device that is both easily aligned and provides simultaneous measurement of a static or dynamic beam for a full characterization of the optical beam.

SUMMARY

In accordance with the present invention, a method and a device for simultaneously measuring and characterizing a scanning optical beam or a plurality of optical beams at multiple arbitrary positions around a print plane is disclosed. Embodiments of the invention may measure beam spatial profile at all sensors, beam waist position in the propagation direction, beam power, beam temporal profile, and beam position.

An optical beam diagnostic device according to some embodiments of the present invention includes one or more sets of individual coherent optical fiber bundles, each set of coherent optical fiber bundles including a plurality of individual optical fiber bundles, wherein a first end of each individual optical fiber bundle is positioned to receive optical information from one or more optical beams around an imaging plane; and a second end of the coherent optical fiber bundles is arranged to transmit the optical information to an optical sensor capable of simultaneously detecting light provided from the second ends of each of the individual optical fiber bundles. In some embodiments, each of the one or more sets of coherent optical fiber bundles transmit the optical information to allow at least one of beam spatial profile, beam position, beam waist, beam power, and beam temporal profile to be determined. In some embodiments, the optical information includes image data. In some embodiments, one or more of the individual optical fiber bundles may be a magnifying bundle.

In some embodiments, the individual optical fiber bundles of each set of coherent optical fiber bundles can be arranged to provide data sufficient to determine one or more characteristics of the one or more optical beams. In some embodiments, the one or more sets of coherent optical fiber bundles includes a set of coherent optical fiber bundles with the first end of each individual optical fiber bundles positioned along a path in the imaging plane. In some embodiments, the one or more sets of coherent optical fiber bundles includes a set of coherent optical fiber bundles with the first end of each individual optical fiber bundles positioned continuously along a second path in the imaging plane. In some embodiments, the one or more sets of coherent optical fiber bundles includes a set of coherent optical fiber bundles with the first end of each individual optical fiber bundles positioned continuously along a third path and wherein the first end is staggered in depth relative to the imaging plane. In some embodiments, data from the set of coherent optical fiber bundles can be utilized to determine a beam waist. The first path, second path, and third path can, in some embodiments, be a scan line of the beam.

In some embodiments, the second face of each of the individual coherent optical fiber bundles of the one or more sets of optical fiber bundles is arranged in an array. In some embodiments, the area or area array sensor is a CCD camera coupled to simultaneously detect light from each of the individual sets of optical bundles. In some embodiments, a data acquisition and control system can be coupled to receive data from the area or area array sensor.

In some embodiments, one or more individual optical sensors are positioned to detect light near the first end of the individual coherent optical fiber bundles in the imaging plane. In some embodiments, the individual optical sensors are coupled to the plane of the first end of the individual coherent optical fiber bundles to transmit the optical information to allow beam power and beam temporal profile measurement.

A method of characterizing a beam according to some embodiments of the invention includes positioning first ends of individual coherent optical fiber bundles such that the first ends are in or around an image plane of the beam to obtain optical information from the beam; positioning second ends of the individual coherent optical fiber bundles in an array on a beam plane; providing an area or area array sensor to collect the optical information provided at the second ends of the individual coherent optical fiber bundles; receiving data from the area or area array sensor into a data acquisition and control system; and analyzing the data to provide one or more characteristic of the beam. In some embodiments, the one or more characteristics of the beam can include at least one of beam spatial profile, beam waist, beam position beam power, and beam temporal profile measurements. In some embodiments, positioning first ends includes positioning first ends of individual coherent optical fiber bundles along a path in the image plane. In some embodiments, positioning first ends includes positioning first ends of individual coherent optical fiber bundles continuously along a second path in the image plane. In some embodiments, positioning first ends includes positioning first ends of individual coherent optical fiber bundles at various heights from the image plane. The first path and the second path can, in some embodiments, each be a scan line.

These and other embodiments are further discussed below with reference to the following figures.

SHORT DESCRIPTION OF THE FIGURES

DETAILED DESCRIPTION

Figure 1:
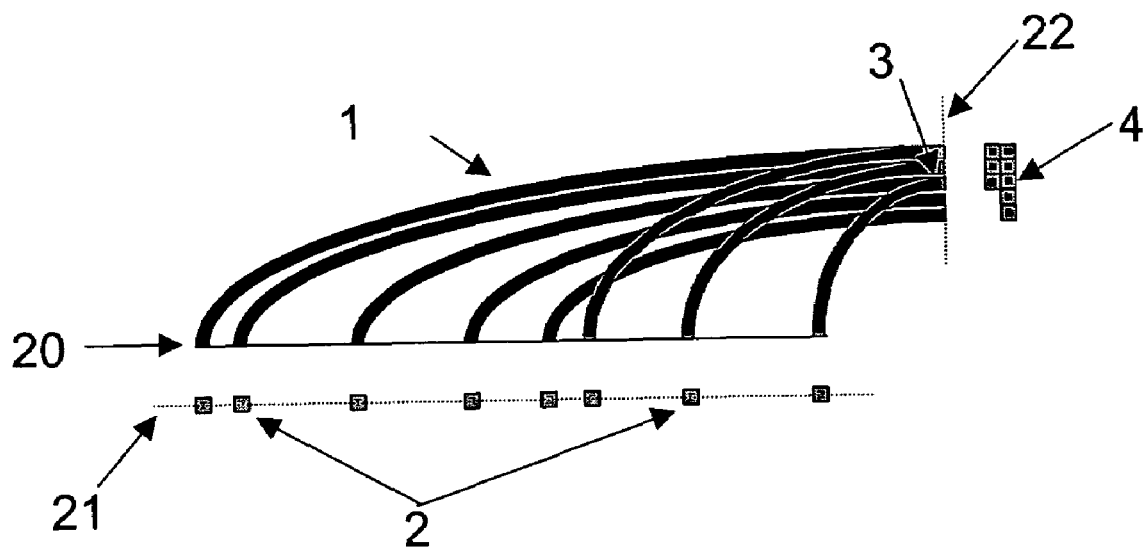
FIG. 1 illustrates an embodiment of a set of individual optical fiber bundles arranged according to some embodiments of the present invention.

The present invention relates to methods and apparatus for obtaining information or characteristics of dynamic moving or static stationary optical beam or beams. Embodiments of the invention can utilize coherent optical fiber bundles to transfer an image or other optical information of a cross-section of the beam so that the beam can be profiled utilizing an area or area array sensor. The beam may be a stationary optical beam. Further, the beam may be dynamically scanning through a scan path. Further, the beam may be modulated. Beam profiler systems according to some embodiments of the present invention can be utilized to characterize these beams.

Utilizing such a sensor, data for characterizing the beam can be simultaneously obtained. In this disclosure, the data is simultaneously obtained when all of the data in one or more raster scans or during the exposure time is captured and transmitted to a data acquisition and analysis instrument within one frame of the area or area array sensor. A frame is the time it takes for one readout cycle of the area or array sensor. A raster is the time it takes a beam to traverse the beam path once and return to its starting position, i.e. the raster time of a raster scan. In a stationary beam, the exposure time is the time the sensor is exposed to the beam. In particular, the methods and apparatus disclosed herein may be used for real-time direct spatial, temporal, focus, and power characterization of optical beams incident on the print plane in laser and LED printers, and the scan plane of laser scanners for applications such as defect scanning, bar code scanning, or physical measurement.

In accordance with some embodiments of the invention, bundles of optical fiber are arranged such that light from an object or beam that is currently being analyzed is routed to a two dimensional array of sensors, such as a charge-coupled device (CCD) camera, CMOS imaging array, or vidicon camera, for example, allowing for simultaneous measurement of the optical beam or beams at multiple points. In some embodiments, a coherent optical fiber bundle array assembly is arranged to transfer images distributed along a scan line at, for example, a print plane to an area or array sensor for profile acquisition. In the area or area array sensor, simultaneous measurement of the optical beam or beams from the multiple arbitrary locations around a print plane can then be obtained. In such a system, data is typically integrated in the area array and transmitted sequentially (either in digital or analog form) to a data acquisition system. The coherent optical fiber bundles can be distributed along any path in the image plane.

In some embodiments, a set of coherent fiber bundles with the endfaces staggered in positions relative to a print plane of, for example, a printer can be utilized to facilitate measurement of the beam propagation caustic to provide the beam focus position and to measure the times-diffraction-limit factor $M^2$, which is defined in ISO Standard 11146 for a print platen, without moving the platen sensor.

Some embodiments of the invention can be utilized to measure beam profiles. A linear arrangement of fiber bundles can be utilized for measurement of beam spatial profile, of beam position, of beam temporal profile, of the position of focused beam waist in the propagation direction, and of absolute and relative beam power. Further, measurements of optical beams with embodiments of the present invention are very fast because all positions can be measured simultaneously, i.e., within a frame of the area or area array sensor. Additionally, extramural coatings on the output end of fiber optic element utilized to hold the fiber optic bundles can delineate the location of the optical fiber bundles. Further, in some embodiments, the ends of some individual optical fiber bundles may be tapered so that they are magnifying. In some embodiments, individual fiber bundles in a set of fiber bundles can be arranged in any fashion in or around a focus plane in order to characterize one or more beams of light. In some embodiments, several sets of coherent fiber bundles, with each set of coherent bundles including individual bundles of coherent optical fibers arranged to provide data for one or more characteristics of a beam are provided. Some characteristics that can be measured include beam profile, beam position, beam power, beam temporal profile, and beam waist measurements. Some sets of bundles can also be utilized for alignment or other functions of a beam characterization device.

Further, a monolithic sensor design utilized in some embodiments of the present invention can provide very accurate metrology. Some embodiments of the invention can utilize area or area array sensors with variable integration times and gain controls for optimizing beam profile image acquisition.

FIG. 1 illustrates a set 1 of individual fiber bundles that can be utilized in a beam profiler according to some embodiments of the present invention. Set 1 shown in FIG. 1 includes a plurality of individual coherent optical fiber bundles, each with first end 2 and second end 3. Fiber bundles of set 1 at first end 2 can be positioned to receive an optical beam along a scan line 21 in a plane 20. Fiber bundles of Set 1 at second end 3 can be arranged to transfer light to area array 4 in a plane 22. There can be any number of individual fiber bundles in set 1. In general, fiber bundles 1 at first end 2 can be positioned along any path or in any pattern in or around plane 20.

Individual fiber bundles can be formed from a number of individual fibers. Each individual fiber can have, for example, a cross section of about 5 or 6 μm. An individual optical fiber bundle may have a cross section of a few millimeters. In embodiments where individual optical fiber bundles transmit image data, individual fibers in the individual fiber bundle are arranged in the bundle to transmit light appropriate from first end 2 to second end 3.

Individual optical fiber bundles in set 1 can have any cross-sectional shape. Some embodiments may be square or rectangular while some may be circular or oval. In some embodiments, individual optical fiber bundles may be magnifying. The cross section of a magnifying individual optical fiber bundle is narrowed at first end 2. In some embodiments, individual coherent optical fiber bundles can be proximity focused on plane 20.

In some embodiments, individual optical fiber bundles in set 1 can be arranged such that first end 2 of the individual optical fiber bundles are arranged at arbitrary positions along a scan line 21 in plane 20. The surfaces at the second end 3 at plane 22 arranged in an area array 4. The number of fiber bundles shown and the arrangement of the first end 2 and second end 3 is arbitrary. However, in some embodiments there is a known correspondence between the positions of individual optical fiber bundles at first end 2 on scan line 21 with the position of that bundle in the array at second end 3, so that an analysis of an incident beam can be made with respect to position on scan line 21 in plane 20. In some embodiments, scan line 21 can be any path in plane 20 where an optical beam can be scanned.

As shown in FIG. 1, optical fiber bundles 1 can be arbitrarily spaced along line 21 in plane 20. In some embodiments, optical fiber bundles 1 at the first end 2 can be evenly spaced along line 21. Any pattern of spacing along line 21 can be utilized. Also as shown in FIG. 1, each fiber bundle in optical fiber bundles 1 is positioned in a two-dimensional array at second end 3. Light from each fiber bundle in optical fiber bundles 1, then, can be simultaneously read by an area or area array (e.g., a charge-coupled device CCD camera, CMOS array, or vidicon camera) positioned to receive light at plane 22. As such, a computer or analysis system coupled to the area or area array sensor can receive data from each of the optical fiber bundles in optical fiber bundles 1 within a single frame for analysis.

Figure 2:
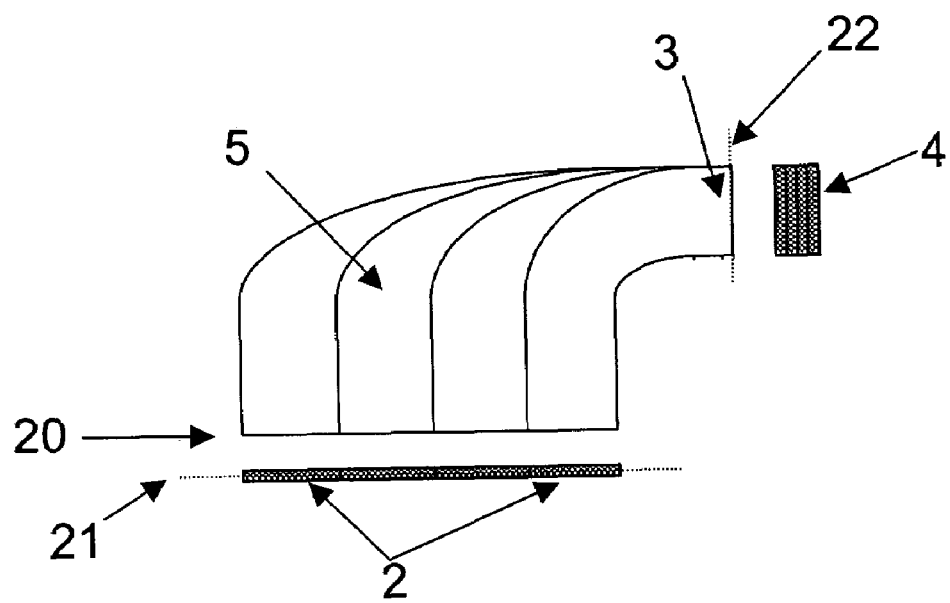
FIG. 2 illustrates another embodiment of a set of individual optical fiber bundles arranged according to some embodiments of the present invention.

FIG. 2 shows an embodiment with a set 5 of coherent optical fiber bundles arranged for continuous coverage along scan line 21. First end 2 of individual optical fiber bundles of set 5 can be shaped and arranged to continuously cover scan line 21. Again, second end 3 of individual fiber bundles are arranged to transmit optical images to an area array sensor position proximate to second end 3 of optical fiber bundles 5. In the arrangement of optical fiber bundles 5 shown in FIG. 2, each of the coherent optical fiber bundles have rectangular cross section, with surfaces at first end 2 arranged for continuous coverage along a line 21 in plane 20 and with the surfaces at second end 3 at plane 22 arbitrarily arranged in area array 4. In some embodiments, each fiber bundle in coherent fiber bundles 5 can be arranged to continuously span a rectangular area on plane 22. The number of fiber bundles shown and the arrangement of the end faces is arbitrary.

Figure 3A:
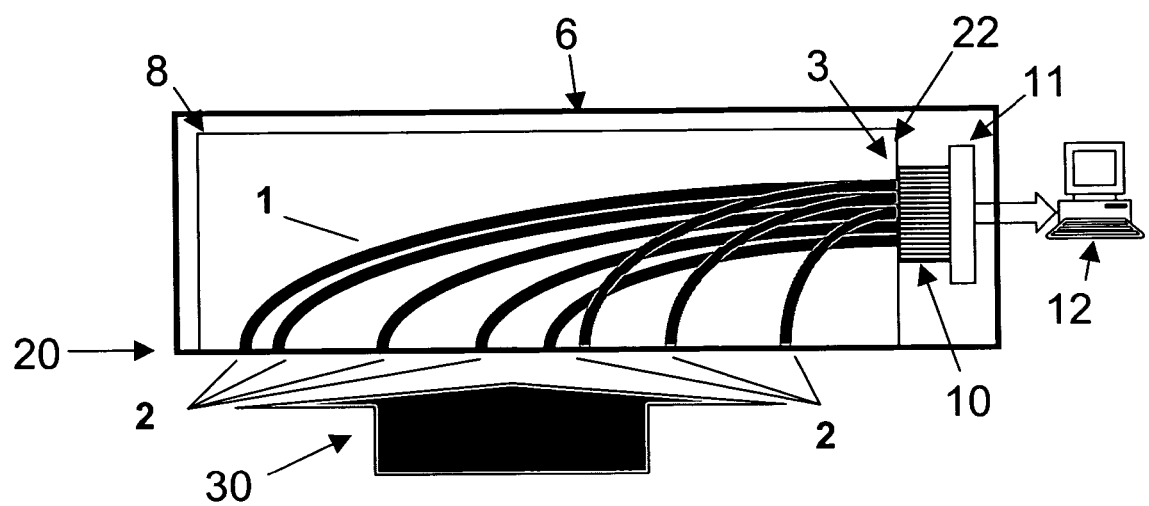
FIGS. 3A through 3C illustrate an embodiment of a print platen beam diagnostic unit according to some embodiments of the present invention.

FIG. 3A shows an embodiment of a beam analyzer 6 according to some embodiments of the present invention. Beam analyzer 6 can be, for example, a print platen beam diagnostic unit. Although FIG. 3A illustrates the use of set 1 shown in FIG. 1, any set or sets of individual optical fiber bundles can be utilized in beam analyzer 6. A coherent optical fiber imaging module 8, which houses and holds the coherent optical fiber bundles, can be positioned along print plane 20, transferring beam images from incident beam 30 to fiber end faces at second end 3 to plane 22. In some embodiments, beam analyzer can be shaped so as to replace a toner cartridge in a laser printer, thereby positioning plane 20 appropriately in relation to a printer head that is being analyzed. From plane 22, the beams from each of the individual optical fiber bundles at second end 3 can be coupled using proximity focusing fiber-optic elements or lenses in fiber face plate 10 to an area or area array sensor 11. In some embodiments, fiber faceplate 10 can also include a beam intensifier. Area or area array sensor 11 provides electrical signals related to the intensity of light received from each optical fiber bundle at plane 22 to a data acquisition and control system 12. Data acquisition and control system 12, then, compiles and analyzes the electrical data received from area or area array sensor 11 to obtain a profile measurement.

Figure 3B:
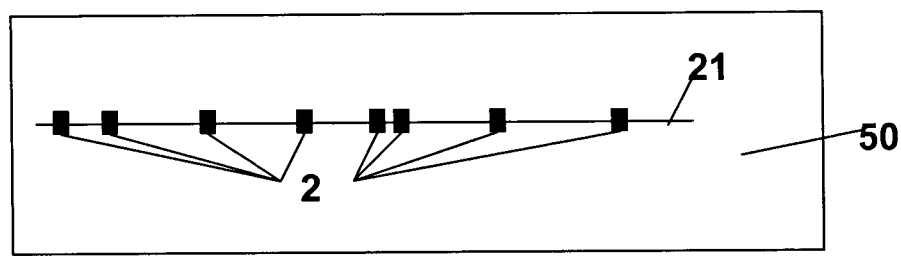

FIG. 3B illustrates the positioning of first end 2 of individual fiber bundles of set 1 along scan line 21. Although shown as a line in FIG. 3B, scan line 21 can be any scan of interest. Individual fiber bundles of set 1 can be fixed in holder 50, for example by epoxy. In some embodiments, holder 50 with first ends 2 fixed in place can be polished to provide a plane 20. In that fashion, first ends 2 of each individual fiber bundle is in plane 20.

Figure 3C:
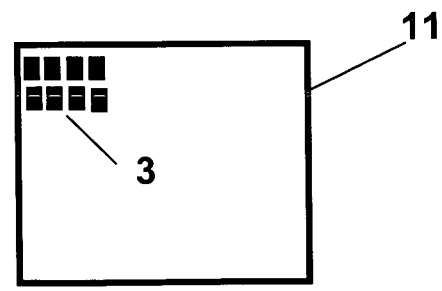

FIG. 3C illustrates the mapping of individual fiber bundles of set 1 onto an array sensor 11. In some embodiments, area array sensor 11 can be a CCD array, CMOS array, or vidicon camera. In some embodiments, a CCD array, for example, can have a pixel size of about 4 or 5 µm. As can be seen in FIG. 3C, very efficient use of the surface of array sensor 11 can be made.

In some embodiments, the cross section of each individual optical fiber bundle is greater than about 3 times the width of beam 30 as it is raster scanned along scan line 21. Additionally, each fiber in an individual optical fiber bundles is approximately matched in size to the pixel size in area sensor 11, for example about 4 or 5 µm. In some embodiments, the numerical aperture (NA) of each individual fiber bundle can be above about 0.5 or 0.6. Typically, in a printer head the beam is normal to imaging surface 20 at top dead center and enters fibers at an angle of incidence not normal to imaging surface 20 at other places in the scan. The NA of each individual fiber bundle is sufficiently high to collect a non-normal incident beam in the raster scan.

As is illustrated in FIG. 3A, area or area array sensor 11 simultaneously measures the optical output, which in some embodiments can be an image, from each optical fiber bundle in the array of optical fiber bundles utilized. Therefore, each electrical signal from area array sensor 11 corresponds to data from one of the individual optical fiber bundles. Data acquisition and control system 12, then, can correlate the data from area or area array sensor 11 with a position on plane 20, allowing for accurate and very fast analysis of beam 30.

In some embodiments, data acquisition and control system 12 can be a computer system. For example, data acquisition and control system 12 can be a PC based computer system operating a program to analyze the data received from area or area array sensor 11. The analysis program executed in control system 12 can include correction software to correct data for misaliguments of first end 2 in plane 20 or second end 3 in plane 22, resulting in skewed mapping of images onto area array 11. Such rotations and translations can be determined by calibrating each analyzer 6 with a known optical beam or known print head. Further, data can be corrected for discrepancies in individual fibers of each fiber bundle. Further, each set of individual fiber bundles provides data for determination of one or more characteristics of beam 30. In such case, analyzer 12 also operates software for determination of those characteristics from the data received from area sensor 11.

Figure 4:
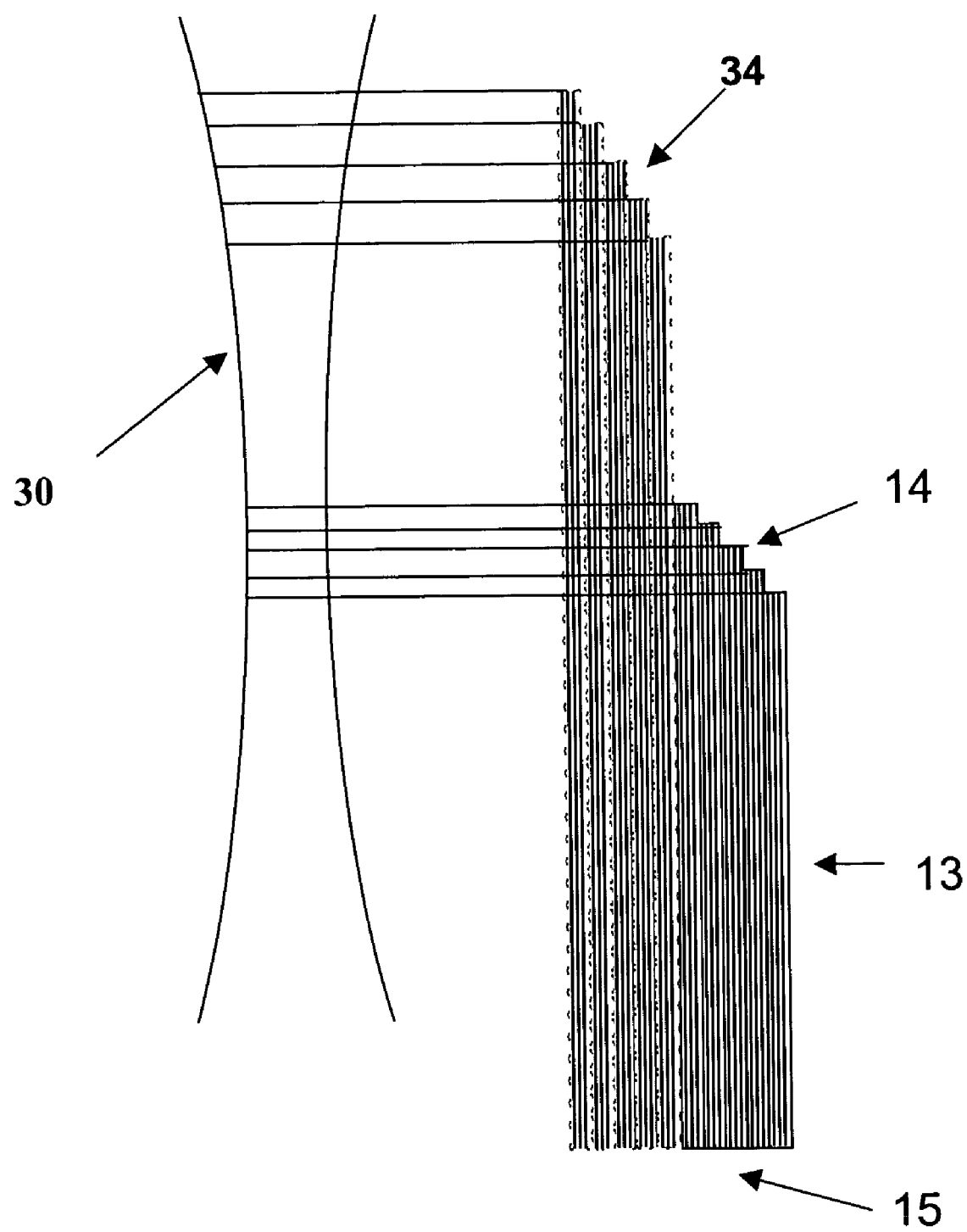
FIG. 4 illustrates an embodiment of a beam caustic sensor for determining beam waist position and times-diffraction-limit factor $M^2$ according to some embodiments of the present invention.

FIG. 4 illustrates an embodiment of a beam waist position sensor comprising segmented individual coherent optical fiber bundle elements 13 with segments for individual beams at different heights at first end 14 and transferred image at surface 15. A measurement of the times-diffraction-limit factor $M^2$, or beam propagation factor k, typically requires multiple measurements of beam width at various locations along the propagation path of beam 30. FIG. 4 shows the cross section of beam 30 along the direction of propagation. In some embodiments, first surface 14 of individual fiber bundles of set 13 allows five measurements along the propagation of beam 30. In some embodiments, set 13 can further include individual fiber bundles with first end 34. In accordance with ISO standard 11146, $M^2$ is determined by five measurements of beam diameter within about one Rayleigh length of the minimum beam waist and five further measurements of beam diameter taken at a distance greater than about two Rayleigh lengths from the minimum beam waist. Set 13 allows for measurements at first end 14 and, in some embodiments, measurements at first end 34. A close measurement of $M^2$ provides for a determination of the focus of beam 30 at image plane 20 by measurement of the waist of beam 30. In some embodiments, measurement of $M^2$ utilizing coherent fiber optic bundles 13 as shown in FIG. 4 conforms with the spirit of ISO Standard 11146.

Figure 5:
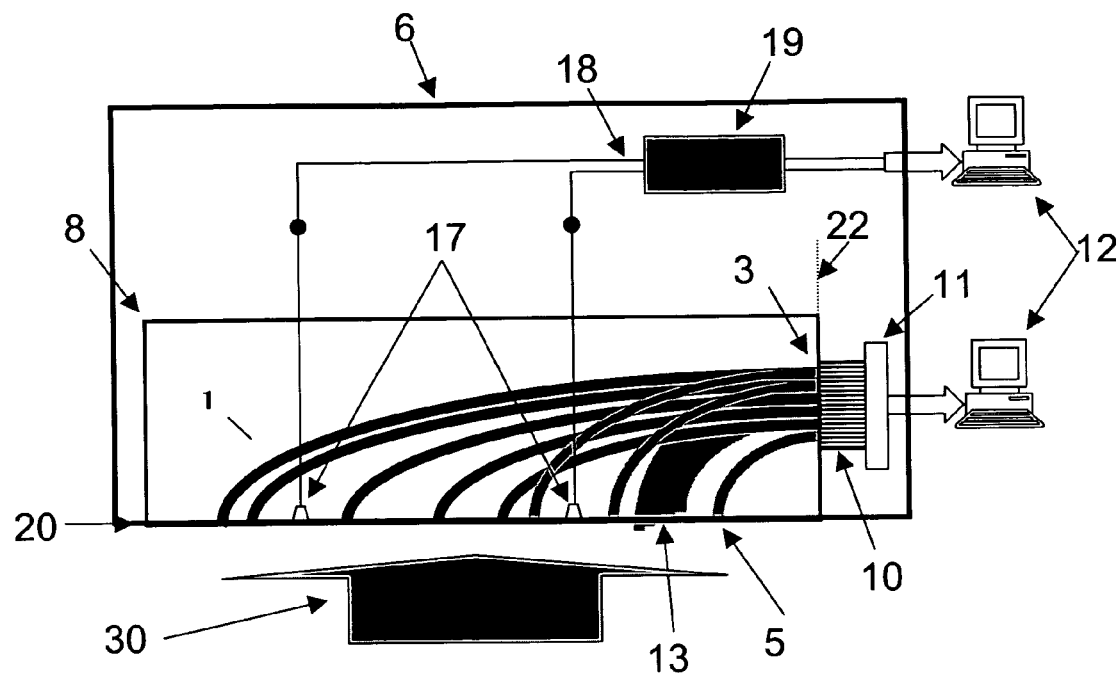
FIG. 5 illustrates another embodiment of a print platen beam diagnostic unit according to some embodiments of the present invention.

FIG. 5 shows an embodiment with a print platen beam diagnostic unit 6 comprising coherent optical fiber imaging module 8 positioned along print plane 20. Beam diagnostic unit 6 shown in FIG. 5 includes several sets of individual fiber bundles. As before, imaging module 8 includes sets of optical fiber bundles positioned according to embodiments of the present invention. As discussed above, the beam images from incident beam 30 are transferred to second fiber end faces 3 at plane 22 and coupled using proximity focusing fiber-optic elements or lenses in fiber face plate 10 to an area array sensor 11. Data from area array sensor 11 is received in data acquisition and sensor control system 12, which characterizes the beam profile based on the data received.

In some embodiments, the optical fiber imaging module 8 can include a set 1 of individual fiber bundles with first ends positioned along a scan line 21 of image plane 20 and a second set 13 with individual fiber bundles with first ends 15 positioned along scan line 21 but staggered around plane 20. Further sets of individual fiber bundles may also be included. Set 1 can be utilized for measurements of beam profile and beam position, for example. Set 13 can be utilized for measurements of beam waist and focus. In some embodiments, a set of individual fiber bundles can be utilized for positioning diagnostic unit 6 with respect to scan line 21. Each fiber bundle can be fixed at a predetermined position on a two-dimensional array at plane 22 for detection by area or area array sensor 11. Further, each set of individual coherent optical fiber bundles is arranged so that the first end is along a line in plane 20, however in some embodiments sets of optical fiber bundles that are utilized for measurement of different entities may be arranged along different lines in plane 20. The second ends of individual fiber bundles in the sets are arranged to utilize an area array 11.

In some embodiments, photodetectors 17 can be directly positioned in plane 20 to measure beam power and temporal profile. In some embodiments, photodetectors 17 may be coupled to plane 20 with optical fibers, in some cases with coherent optical fiber bundles. The photodetector signals 18 from photodetectors 17 can be input to signal conditioning electronics 19. The output signals from electronics 19 can be received by data acquisition system 12 for further analysis.

Figure 6:
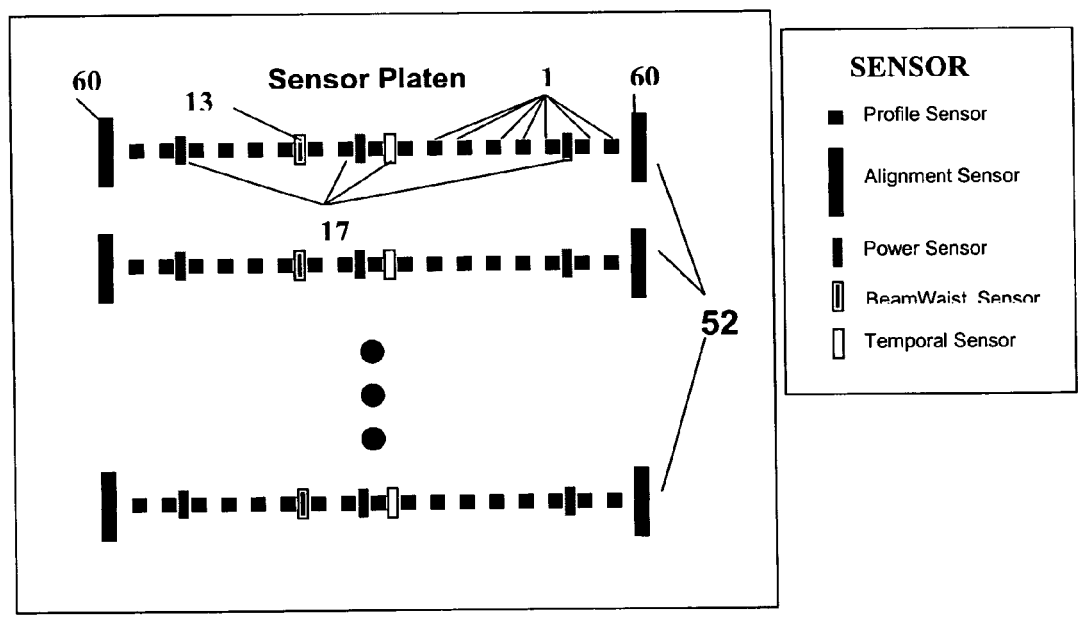
FIG. 6 illustrates an embodiment of sensor platen design for laser printers according to some embodiments of the present invention.
Figure 7:
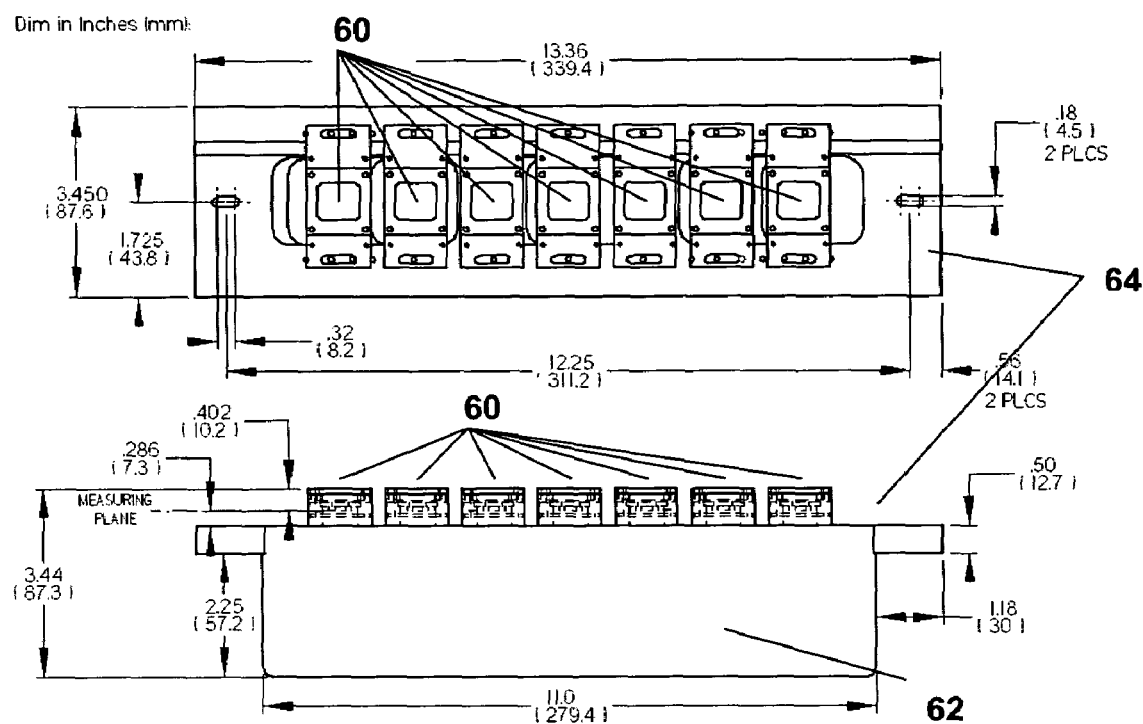
FIG. 7 shows an embodiment of a camera head for a conventional beam profiler head.
Figure 8:
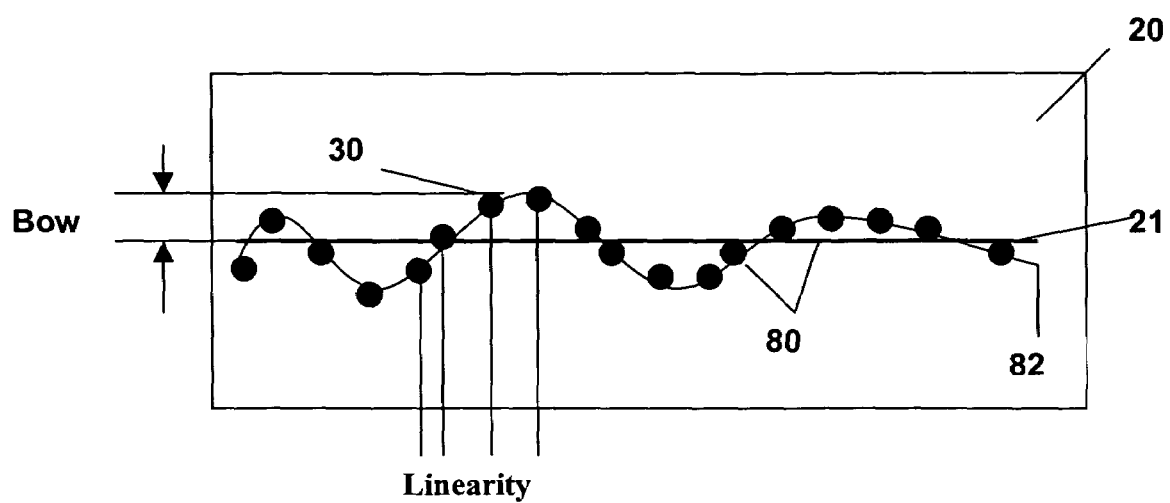
FIG. 8 illustrates a raster scan from a print head.

FIG. 6 shows an embodiment of a sensor platen design for laser printers. As discussed above, the sensor platen design can be shaped, for example, like a toner cartridge for placement directly adjacent a printer head. As shown in FIG. 6, sets of individual coherent optical fiber bundles may be arranged along more than one scan line 52. In general, each of scan lines 52 receives light from one raster scan from the print head and therefore there are as many scan lines 52 as there are individual beams scanned by the printer head. Color printers, for example, may have multiple scan lines.

As shown in FIG. 6, a first set 60 of individual fiber bundles can have elongated individual fiber bundles that assist in aligning the sensor platen with the printer head. A second set 1 of individual fiber bundles includes individual fiber bundles with first ends 2 arranged along scan line 52. A third set 13 is also shown, with optical fiber bundles arranged along scan line 52 with first end 15 around plane 20. Any number of sets of individual optical fiber bundles can be arranged along line 21, limited only by physical placement of individual optical fiber bundles themselves. The sensor platen illustrated in FIG. 6 also includes photodetectors 17 (or optical fibers coupled to photodetectors) for measuring the absolute beam power and beam temporal profile.

As shown in FIG. 6, and illustrated in the layout of sets of individual coherent fiber bundles in the platen and fixed optical sensors allows for collection of data to provide full characterization of an optical beam scanned along scan lines associated with lines 52. With such arrangements, beam profiles, beam positions, beam waists, temporal, and power data can be determined.

As described above, a sensor platen according to embodiments of the present invention includes one or more sets of individual coherent optical fiber bundles of arbitrary cross section configured with one end positioned arbitrarily along a path on a plane. The individual fiber bundles are mounted perpendicular to the plane in order to collect light incident on the plane, within the limitations of the fiber NA. The other end of all the fibers can be brought together and focused onto an area or area array sensor, such as a CCD, CMOS imaging array, or a vidicon camera. The individual bundles transfer the image of the incident beam at the sensor platen to the imaging device for simultaneous measurement of the respective images (all the sensors are read from the imaging device during the same readout cycle). Additionally, a set of individual coherent optical fiber bundles can be mounted such that the first end faces are slightly staggered in position relative to the print plane, so as to facilitate the measurement of the beam at different positions along the direction of propagation and thus to provide for measurement of the location of the focused beam waist. For beam power and beam temporal profile measurement, a photodetector or multiple photodetectors are positioned along the scan path in the print plane amongst the coherent fiber bundles. An entire printer platen according to the present invention can form a single monolithic device.

Some embodiments of the invention can be utilized in a VCSELS or LED printer diagnostic instrument designed to measure CW or Pulsed laser beam characteristics at multiple positions along the print plane. Some embodiments of printer platen or diagnostic instrument according to the present invention can measure beams in a scanning laser print beam, without the need to stop the polygonal scanning mirror of the printer head for adjustments. Therefore, real-time dynamic adjustments of f-theta lenses in print heads that use either ball bearing or air bearing spindles can be made with diagnostic instruments according to the present invention. Further, some embodiments of the present invention can be utilized to measure the characteristics of the polygonal scanner system including the print beam.

Embodiments of a diagnostic instrument according to the present invention can be operated as a standalone instrument or integrated into automated test and measurement systems. As a standalone instrument, it is useful in research and development applications to configure, test and verify designs, and also useful in manufacturing and production for adjustments of print-head optics. As an automated system, it finds applications as a tool for final adjustments and quality assurance of assembled print heads. In either case, an advantage of diagnostic instruments according to embodiments of the present invention over standard beam profilers like Photon's BeamScan, NanoScan or BeamProfiler systems include an enormous savings in measurement time and improvements in productivity throughput, a key to producing lower cost laser or LED printers.

Analysis of the acquired optical beam image data from diagnostic instruments according to the present invention can provide parameters such as beam width, spot size, and centroid position. To look at the scanning beams print spot, for example, the beam is modulated "ON" for a single dot time or print spot as in an actual laser printer. By modulating the beam "ON" or "OFF" at the appropriate moments as the beam scans across the continuous or multitude of individual sensors, beam parameters measured can be used individually or collectively to determine print head parameters such as spot size, profile, power, facet-facet tilt, facet-facet reflectivity, scan-to-scan jitter, scan line bow, scan line distortion, and start-of-scan jitter. For pulsed laser beams the combined electrical/optical convolution can also be measured. LED printer arrays may be analyzed and include many of the above measures as well as the contrast between adjacent or spaced devices by again turning appropriate devices "ON" or "OFF".

In summary, some embodiments of the invention collapse a wide scan path (linear, circular or arbitrary path shape that repeats) to a single or a few small area sensors such as CCD or vidicon or CMOS detector that is then captured in a computer for detailed analysis.

The embodiments discussed here are examples only and are not intended to be limiting of the invention. One skilled in the art will recognize multiple variations that are intended to be within the spirit and scope of the present disclosure.

We claim:

1. A method of characterizing a beam, comprising:
    positioning first ends of individual coherent optical fiber bundles such that one or more sets of coherent optical fiber bundles are positioned to receive light from specific spatial locations around an image plane of the beam to obtain optical information from the beam;
    positioning second ends of the individual coherent optical fiber bundles in an array on a beam plane, positions on the array on the beam plane corresponding with the specific spatial locations;
    providing an area or area array sensor to collect the optical information provided at the second ends of the individual coherent optical fiber bundles;
    receiving data from the area or area array sensor into a data acquisition and control system; and
    analyzing the data to provide one or more characteristics of the beam.

2. The method of claim 1, wherein the one or more characteristics of the beam includes at least one of beam spatial profile, beam position, beam waist, beam power, and beam temporal profile measurements.

3. The method of claim 1, wherein positioning first ends includes positioning first ends of individual coherent optical fiber bundles along a line in the image plane.

4. The method of claim 1, wherein positioning first ends includes positioning first ends of individual coherent optical fiber bundles continuously along a second line in the image plane.

5. The method of claim 1, wherein positioning first ends includes positioning first ends of individual coherent optical fiber bundles at various heights from the image plane.

6. A method of characterizing a printer head, comprising:
positioning a beam profiler relative to the printer head, the beam profiler comprising one or more sets of coherent optical fiber bundles, each set of coherent optical fiber bundles including one or more individual optical fiber bundles;
acquiring data from an area or area array sensor coupled to simultaneously receive data from the individual optical fiber bundles; and
analyzing the data to determine at least one characteristic of a beam from the printer head.

7. A method of qualifying and adjusting a printer head, comprising:
positioning a beam profiler relative to the printer head, the beam profiler comprising one or more sets of coherent optical fiber bundles, each set of coherent optical fiber bundles including one or more individual optical fiber bundles arranged to provide optical information from the printer head to an area or area array sensor;
acquiring data corresponding to the optical information from the area or area array sensor;
analyzing the data to provide at least one characteristic of the printer head; and
adjusting the printer head to affect the at least one characteristic.

8. The method of claim 7, further including rejecting the printer head based on one of the at least one characteristic of the printer head.

9. The method of claim 7, wherein the printer head is a laser printer head.

10. The method of claim 7, wherein the printer head is a LED printer head.

11. The method of claim 7, wherein the area or area array sensor includes a CCD camera.

12. The method of claim 7, wherein the area or area array sensor includes a CMOS array.

13. The method of claim 7, wherein the area or area array sensor includes a vidicon camera.

* * * * *